US007863149B2

(12) United States Patent
Kundalgurki et al.

(10) Patent No.: US 7,863,149 B2
(45) Date of Patent: Jan. 4, 2011

(54) METHOD FOR FABRICATING A CAPACITOR

(75) Inventors: Srivatsa Kundalgurki, Richmond, VA (US); Peter Moll, Dresden (DE); Dirk Manger, Dresden (DE); Kristin Schupke, Weixdorf (DE); Till Schloesser, Dresden (DE)

(73) Assignee: Qimonda AG, Munich (DE)

( * ) Notice: Subject to any disclaimer, the term of this patent is extended or adjusted under 35 U.S.C. 154(b) by 244 days.

(21) Appl. No.: 11/223,800

(22) Filed: Sep. 9, 2005

(65) Prior Publication Data
US 2006/0079049 A1 Apr. 13, 2006

(30) Foreign Application Priority Data
Sep. 9, 2004 (DE) ............ 10 2004 044 678

(51) Int. Cl.
*H01L 21/20* (2006.01)
(52) U.S. Cl. ............ 438/396; 438/255; 438/298; 257/E21.01
(58) Field of Classification Search ............ 438/241
See application file for complete search history.

(56) References Cited

U.S. PATENT DOCUMENTS

| | | | | |
|---|---|---|---|---|
| 4,236,168 | A * | 11/1980 | Herbst | 257/230 |
| 4,905,065 | A | 2/1990 | Selcuk et al. | |
| 5,478,768 | A * | 12/1995 | Iwasa | 438/253 |
| 5,998,251 | A * | 12/1999 | Wu et al. | 438/241 |
| 6,211,008 | B1 | 4/2001 | Yu et al. | |
| 6,403,444 | B2 * | 6/2002 | Fukuzumi et al. | 438/396 |
| 6,448,622 | B1 * | 9/2002 | Franke et al. | 257/415 |
| 6,667,209 | B2 * | 12/2003 | Won et al. | 438/253 |
| 2001/0005631 | A1 * | 6/2001 | Kim et al. | 438/689 |
| 2003/0017669 | A1 | 1/2003 | Kiyotoshi et al. | |
| 2003/0136996 | A1 | 7/2003 | Park | |
| 2004/0108536 | A1 * | 6/2004 | Lee et al. | 257/301 |
| 2004/0150030 | A1 | 8/2004 | Nishimura et al. | |
| 2004/0164335 | A1 | 8/2004 | DeBoer et al. | |
| 2005/0023640 | A1 * | 2/2005 | Choi et al. | 257/532 |
| 2006/0046419 | A1 * | 3/2006 | Sandhu et al. | 438/386 |
| 2006/0131632 | A1 * | 6/2006 | Chae | 257/300 |
| 2007/0117335 | A1 * | 5/2007 | Sandhu et al. | 438/306 |
| 2007/0241428 | A1 * | 10/2007 | Greenberg et al. | 257/587 |

OTHER PUBLICATIONS

Oehrlein, G. S., et al., "Selective Dry Etching of Germanium with Respect to Silicon and Vice Versa," J. Electrochem. Soc., May 1991, vol. 138, No. 5, pp. 1443-1452.

Oehrlein, G. S., et al., "Interactive Effects in the Reactive Ion Etching of SiGe Alloys," Appl. Phys. Lett., May 20, 1991, vol. 58, No. 20, pp. 2252-2254.

Guo, L., et al., "Reactive Ion Etching of $Si_{1-x}Ge_x$ Alloy with Hydrogen Bromide," Journal of Crystal Growth, 2001, 227-228, pp. 801-804.

Oh, J-H, et al., "Study of the Robust Stack Cell Capacitor Structure Using Double Mold Oxide (DMO) Technology for a Gigabit-Density DRAM and Beyond," Journal of the Korean Physical Society, Dec. 2002, vol. 41, No. 6, pp. 884-887.

Chen, J., et al., "Formation of Polycrystalline Silicon Germanium/ $HfO_2$ Gate Stack Structure Using Inductively Coupled Plasma Etching," J. Vac. Sci. Technol., Jul./Aug. 2003, vol. 21, No. 4, pp. 1210-1217.

Park, J.M., et al., "Novel Robust Cell Capacitor (Leaning Exterminated Ring Type Insulator) and New Storage Node Contact (Top Spacer Contact) for 70nm DRAM Technology and Beyond," Symposium on VLSI Technology Digest of Technical Papers, Sep. 2004, pp. 34-35.

* cited by examiner

*Primary Examiner*—Steven Loke
*Assistant Examiner*—David Goodwin

(57) ABSTRACT

In a method for fabricating a capacitor that includes an electrode structure (80), an auxiliary layer (40) is formed over a substrate (10). A recess (60), which determines the shape of the electrode structure (80), is etched into the auxiliary layer (40), and the electrode structure of the capacitor is formed in the recess. As an example, the auxiliary layer can be a semiconductor layer (40).

21 Claims, 14 Drawing Sheets

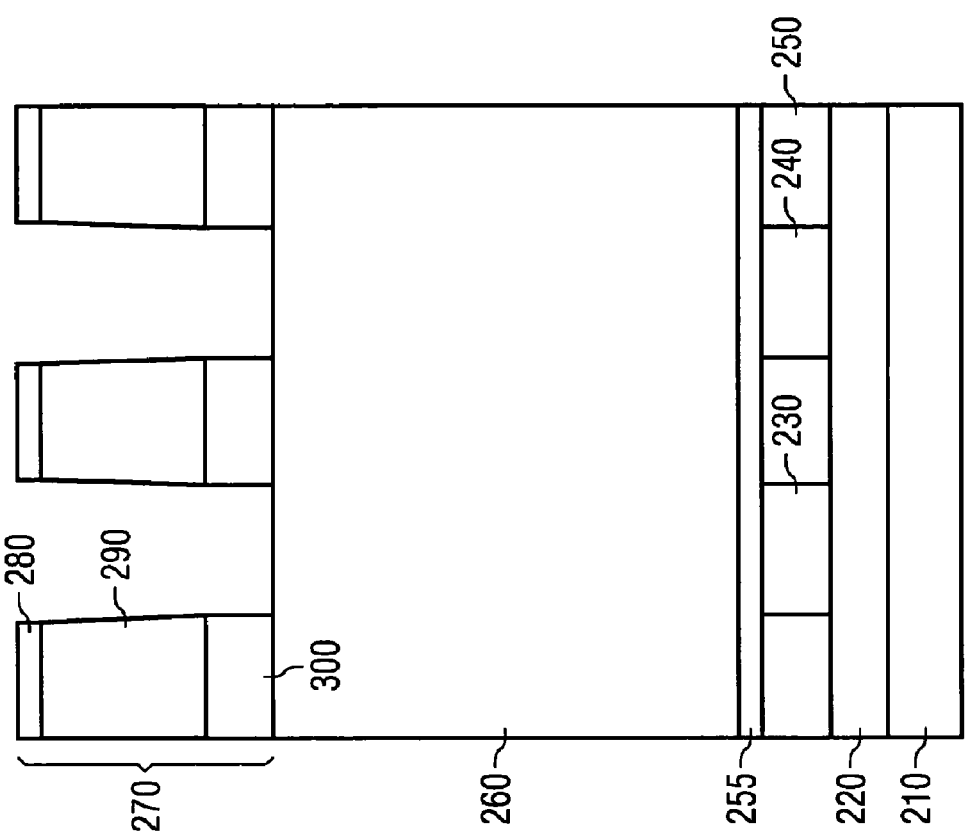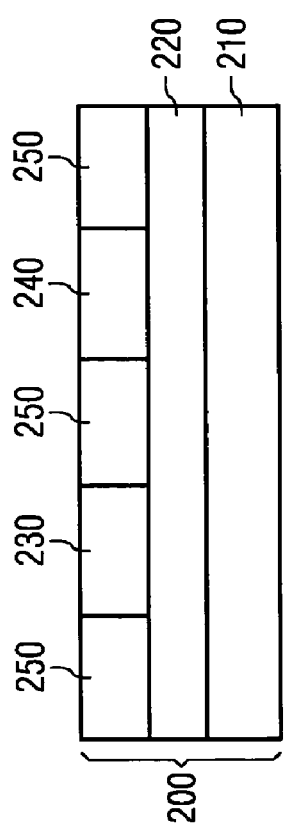

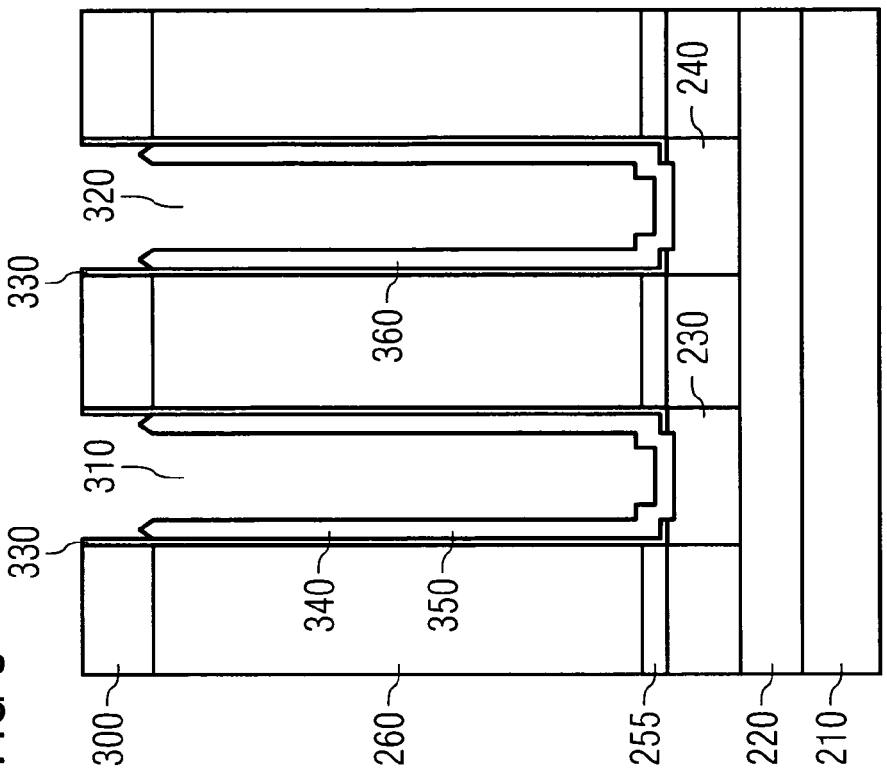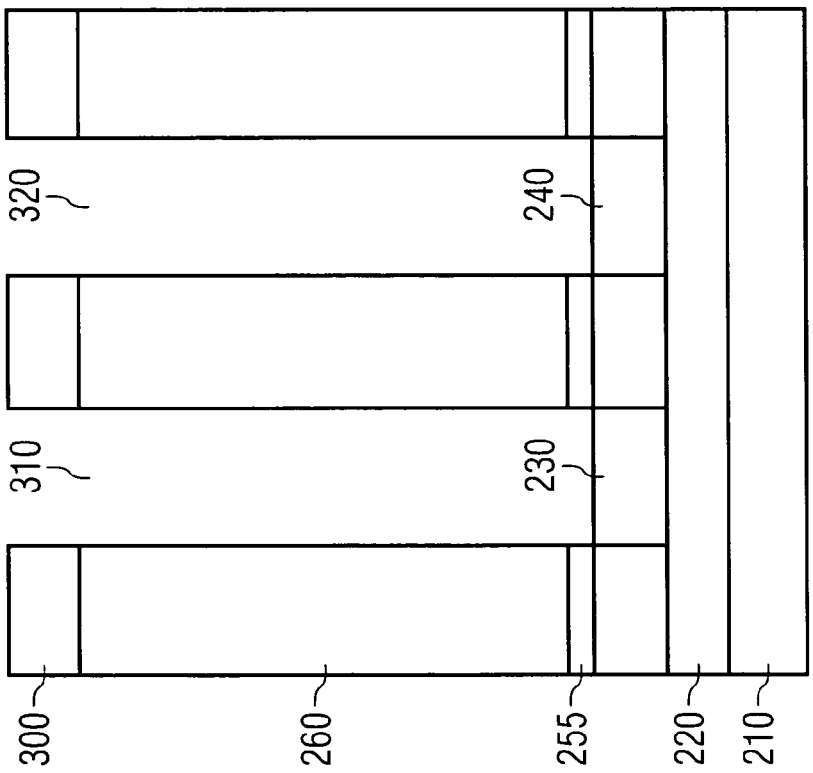

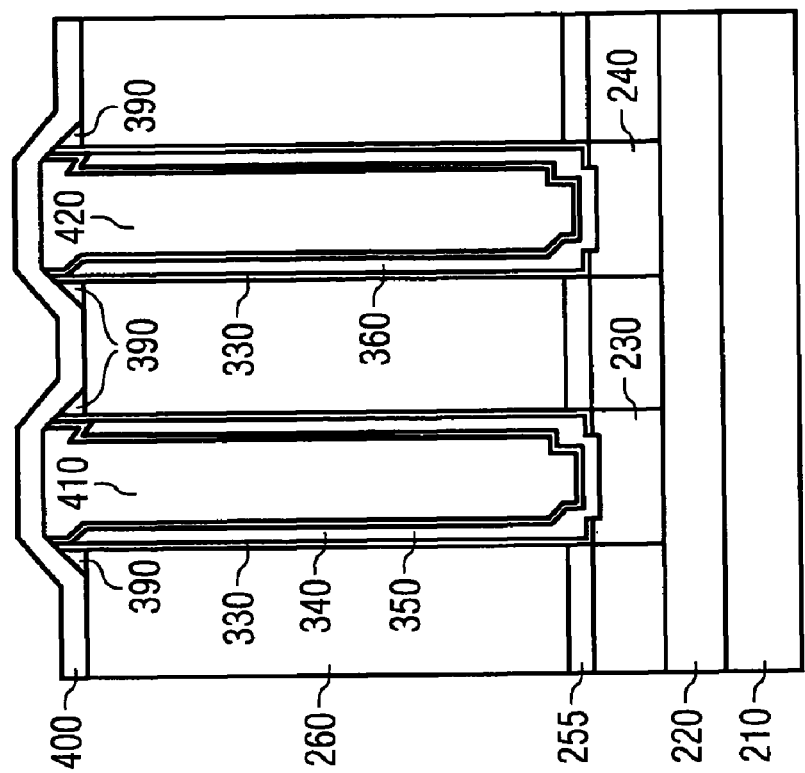
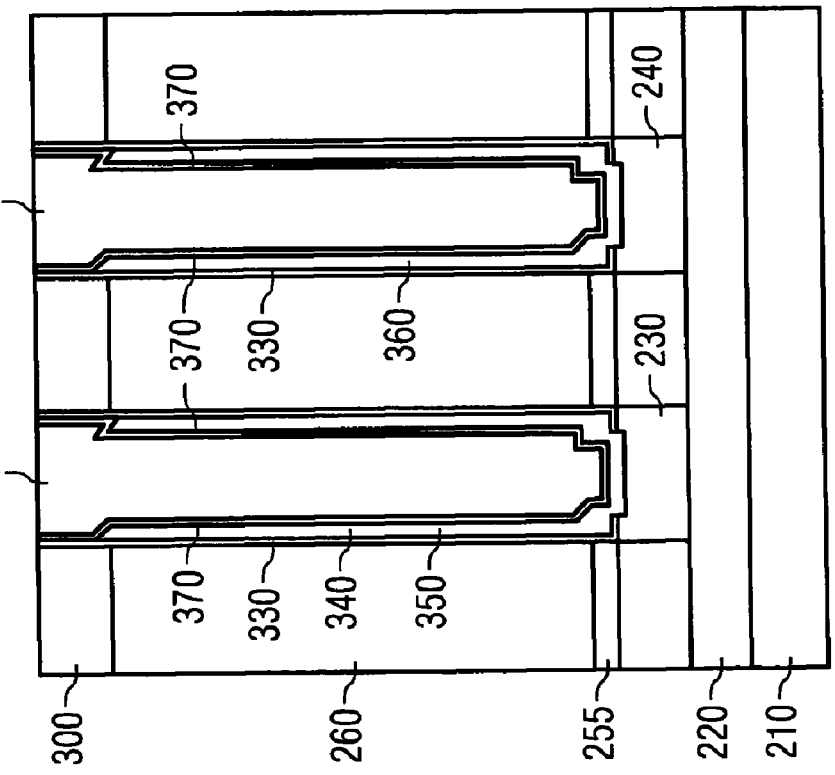

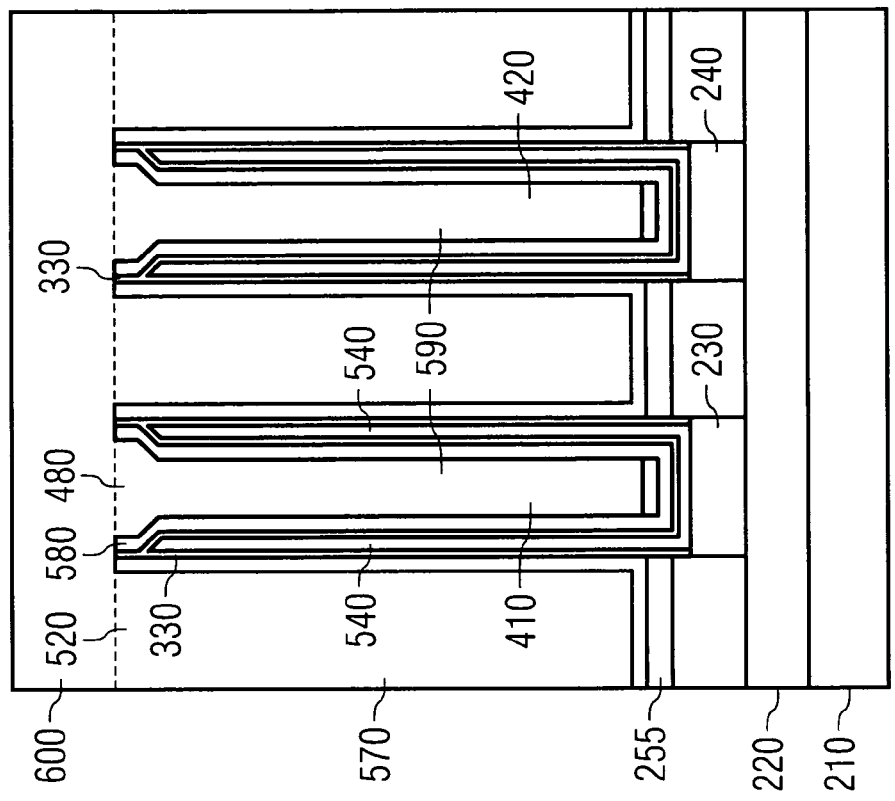
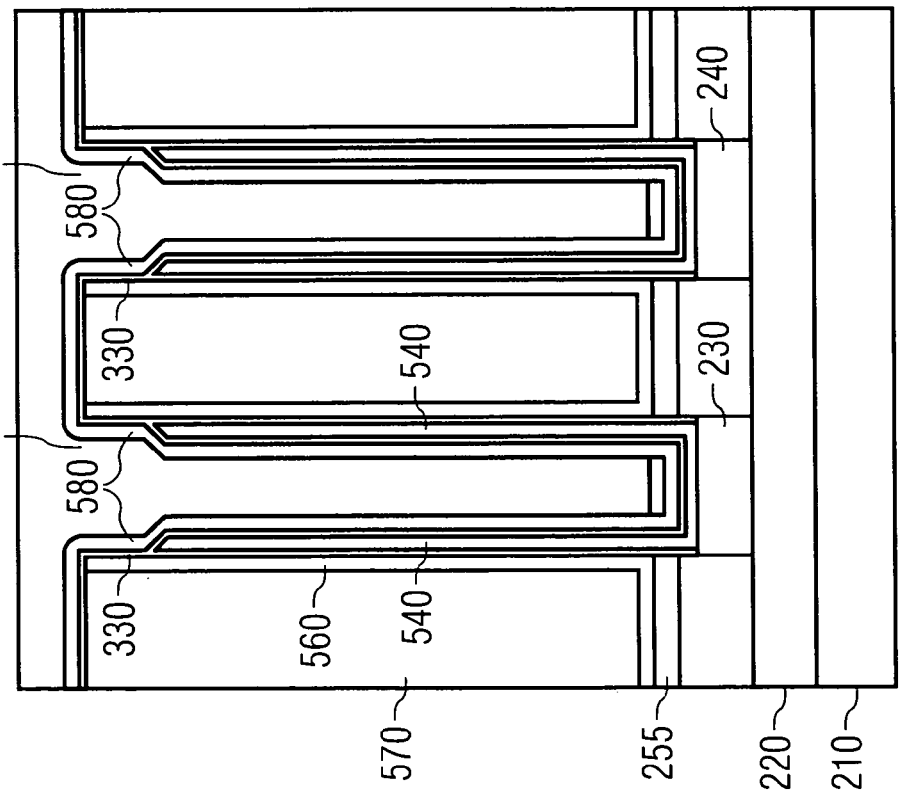

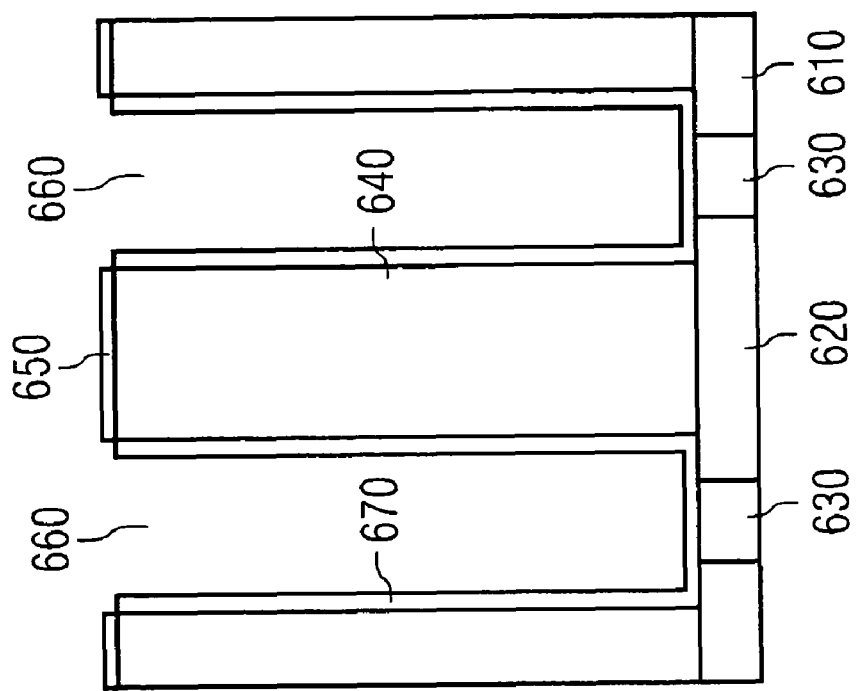
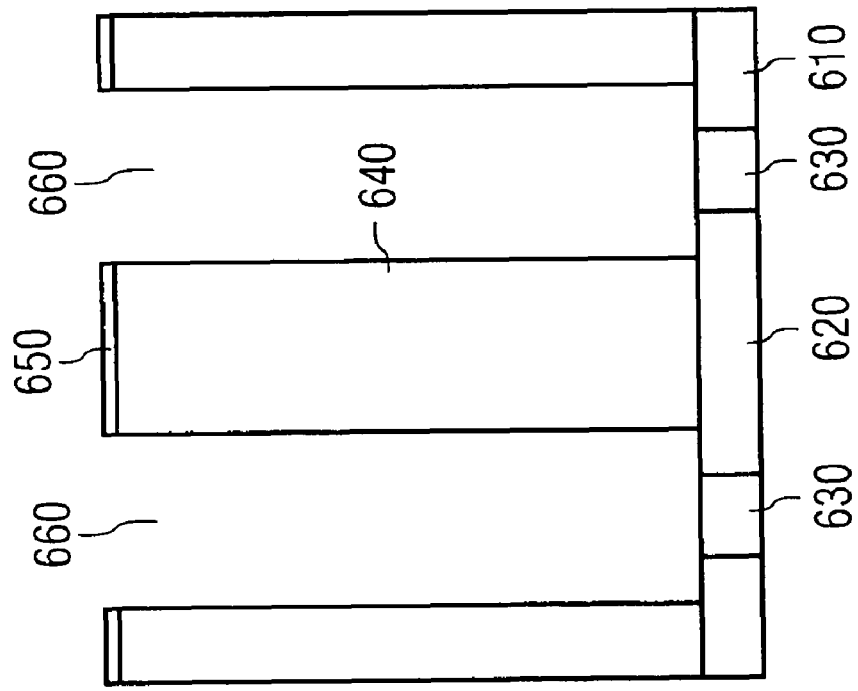

METHOD FOR FABRICATING A CAPACITOR

This application claims priority to German Patent Application 10 2004 044 678.4, which was filed Sep. 9, 2004, and is incorporated herein by reference.

TECHNICAL FIELD

The invention relates generally to electronic components and, in one embodiment, to a method of fabricating a capacitor.

BACKGROUND

A method of making a capacitor is known from the document "Study of the Robust Stack Cell Capacitor Structure using Double Mold Oxide (DMO) Technology for a Gigabit-Density DRAM and beyond" (Jeong-Hoon Oh, Hoon Jeong, J. M. Park, J. Y. Park, K. H. Hong, Y. J. Choi, K. H. Lee, T. Y. Chung, Y. J. Park and Kinam Kim; Journal of the Korean Physical Society, Vol. 41, No. 6, December 2002, pp. 884-887). In this known method, a "cup-shaped" capacitor for a gigabit DRAM memory element is fabricated. In the text that follows, a cup-shaped capacitor is to be understood as meaning that the electrode structure of the capacitor is cup-shaped or pot-shaped, or at least approximately cup-shaped or pot-shaped in form.

Within the known fabrication method, first of all an auxiliary layer of silicon oxide is applied to a substrate with a terminal pad. The thickness of the auxiliary layer in this case predetermines the overall height of the "capacitor cup" or "electrode cup" that is to be produced. A recess is etched into the silicon oxide auxiliary layer, extending all the way to the terminal pad on the substrate. Then, a silicon layer is deposited in the region of the recess. This silicon layer will subsequently form an interior electrode of the cup-shaped capacitor. In a subsequent process step, the silicon oxide auxiliary layer is completely removed, so that the interior electrode of the "subsequent" capacitor "remains in place". Then, the interior electrode is coated with a dielectric, to which an exterior electrode layer of the capacitor is applied. This completes the cup-shaped capacitor.

Another known method for fabricating a cup-shaped capacitor is described in the document "Novel Robust Cell Capacitor (Leaning Exterminated Ring type Insulator) and New Storage Node Contact (Top Spacer Contact) for 70 nm DRAM technology and beyond" (J. M. Park, Y. S. Hwang, D. W. Shin, M. Huh, D. H. Kim, H. K. Hwang, H. J. Oh, J. W. Song, N. J. Kang, B. H. Lee, C. J. Yun, M. S. Shim, S. E. Kim, J. Y. Kim, J. M. Kwon, B. J. Park, J. W. Lee, D. I. Kim, M. H. Cho, M. Y. Jeong, H. J. Kim, H. J. Kim, H. S. Kim, G. Y. Jin, Y. G. Park and Kinam Kim); (2004 Symposium on VLSI Technology Digest of Technical Papers, pages 34-35).

SUMMARY OF THE INVENTION

In one aspect, the invention provides a method for fabricating a capacitor in which the desired shape or spatial configuration of the electrode structure of the capacitor can be produced particularly easily and with minimal deviation from the predetermined "desired shape" or from predetermined "desired parameters".

Embodiments of the invention provide a method for fabricating a capacitor that includes an electrode structure in which an auxiliary layer is applied to a substrate. A recess determines the shape of the electrode structure and is etched into the auxiliary layer. The electrode structure of the capacitor is formed in the recess.

According to embodiments of the invention, it is therefore provided that the auxiliary layer used is a semiconductor layer.

One major advantage of the method according to embodiments of the invention consists in the fact that the structure parameters that are predefined for the electrode structure of the capacitor can be maintained particularly well. By way of example, it is possible to achieve the effect whereby the recess used to fabricate the capacitor is only slightly tapered and is still substantially round in shape; a "bowing" effect, i.e., a barrel-shaped widening in the upper region of the recess, can be avoided with the method according to the invention, unlike with the known method. According to the invention, this is achieved by virtue of the fact that a semiconductor material is used for the auxiliary layer, i.e., a material that is very easy to mask and pattern, since it has a very high etching selectivity compared to standard mask materials and electrode materials. This means that the auxiliary layer can be patterned and then "etched away" without the etching mask and, therefore, the shape of the recess that is to be etched or, in a subsequent part of the method, the electrode structure of the capacitor suffering.

A particularly compact overall form combined, at the same time, with a high capacitance is achieved if the capacitor has a cup-like electrode shape. Capacitors with a cup-like electrode shape are known, for example, from the document cited in the introduction. These cup-shaped capacitors are used in particular for memory elements, in particular for DRAM memory elements.

If the capacitor is used in an integrated electronic circuit or in a memory element, it is preferably for the capacitor to be integrated in the semiconductor structure thereof.

According to an advantageous configuration of the method, it is provided that the semiconductor layer is a silicon-containing layer. In such a case, the recess can, for example, be produced analogously to what is known as a deep trench etch, as is known to be used for isolating separate electronic components within a silicon substrate or as is used for etching holes in silicon substrates for what are known as DT capacitors for DRAM memory elements.

The auxiliary layer is preferably a silicon-germanium layer (SiGe layer) or SiGe alloy. A silicon-germanium layer is particularly easy to process by etching techniques, since in particular silicon-germanium layers can be etched using etching liquids containing hydrogen peroxides or even using pure hydrogen peroxide. Both the etching of the recess and the removal of the auxiliary layer during subsequent production steps can, therefore, be carried out using hydrogen peroxide. Hydrogen peroxide has the particular advantage in this context that it scarcely attacks suitable electrode materials, such as for example titanium nitride, doped silicon or the like, at all, which means that electrode layers from material of this type suffer scarcely any damage during an etch using hydrogen peroxide. If hydrogen peroxide is used as etchant, the SiGe material has a Ge content of preferably over 20%, since the etching rate of SiGe material is too low if the Ge contents are too low. Ge contents of at least 40%, preferably of at least 60%, are regarded as particularly suitable. A pure silicon layer is likewise suitable, since this material can be patterned with particularly good profile control using an HBr/NF$_3$-based anisotropic plasma etching process and since this likewise permits good selectivities during removal of this layer with respect to SiN, SiO$_2$ and TiN.

As has already been mentioned, the capacitor can have a cup-shaped structure with a cup inner wall and a cup outer wall. By way of example, an inner electrode of the capacitor is formed by the cup inner wall, whereas an outer electrode of the capacitor, which is separated from the inner electrode by an insulator layer, is formed by the cup outer wall of the cup-shaped capacitor.

Alternatively, it is also possible to fabricate a cup-shaped capacitor in which an exterior electrode forms both the cup inner wall and the cup outer wall and completely encloses an interior electrode of the capacitor.

In the latter configuration of the cup-shaped capacitor, it is considered advantageous if that part of the exterior electrode that forms the cup inner wall and that part of the exterior electrode that forms the cup outer wall are produced in the same process step. This can be carried out, for example, in such a manner that the inner side of the recess is coated with a conductive electrode layer, thereby forming the interior electrode of the cup-shaped capacitor. Then, the interior electrode is uncovered by the auxiliary layer being completely removed. Then, in subsequent process steps, the exterior electrode is produced and the cup-shaped capacitor completed. For this purpose, by way of example, an insulation layer is applied to the interior electrode on both the inner side of the cup and the outer side of the cup, and then a further conductive electrode layer, as exterior electrode, is deposited on the insulation layer.

That part of the exterior electrode that forms the cup inner wall and that part of the exterior electrode that forms the cup outer wall can be produced in the same process step or in different process steps. In this context, it is possible for the exterior electrode to be produced before the interior electrode, or vice-visa.

To produce electrical contact between that part of the exterior electrode that forms the cup inner wall and that part of the exterior electrode that forms the cup outer wall, it is preferable for a conductive capping layer, in particular a doped silicon layer, to be applied to the electrode material.

The interior electrode and/or the exterior electrode, i.e., accordingly the inner electrode and/or the outer electrode of the capacitor, are preferably formed from titanium nitride material or material that contains titanium nitride. Alternatively, it is also possible to use silicon-containing material, in particular doped silicon, as electrode material.

Moreover, the capacitor can be connected to a terminal of a transistor, in particular of an MOS transistor, for example if the capacitor is to be used to fabricate a memory element, in particular a DRAM memory element. By way of example, the method described can be used to fabricate a COB (capacitor-over-bitline) memory element.

According to a particularly preferred variant of the method according to the invention, it is provided that the electrode structure is always mechanically supported throughout the entire method.

If a cup-shaped electrode structure is used, it is preferable for this electrode structure to be mechanically supported by the auxiliary layer that remains in the outer region of the cup.

If the auxiliary layer in the outer region of the cup is removed during the method, it is preferable for the cup inner region of the cup-shaped electrode structure to previously have been filled with a mechanically supporting filling. In this case, relatively stable column-like structures, which are able to withstand even high mechanical forces, are formed. Column-like structures of this type are much more mechanically stable than cup-shaped electrode structures in which both the inner region of the cup and the outer region of the cup have to make do without supporting material and in which mechanical problems—as described in the document mentioned in the introduction "Study of the Robust Stack Cell Capacitor Structure using Double Mold Oxide (DMO) Technology for a Gigabit-Density DRAM and beyond"—may arise.

According to another embodiment of the invention, there is provided a method for fabricating a capacitor that includes an electrode structure, in which an auxiliary layer is applied to a substrate. A recess that determines the shape of the electrode structure is etched into the auxiliary layer and the electrode structure of the capacitor is formed in the recess. During the production of the electrode structure, at each point in the process the structure that has been produced by that point in the process is mechanically supported.

Accordingly, it is provided in accordance with the invention that during the production of the electrode structure, the respective structure is mechanically supported at each point in the process.

One major advantage of this method according to embodiments of the invention consists in the fact that the electrode structure or its "precursor structures", i.e., the structures that will subsequently form or belong to the electrode structure, are not "alone" and unsupported at any point in time. In the known method described in the introduction, the silicon oxide auxiliary layer is completely removed during production of the electrode structure, as has already been explained, and consequently the interior electrode of the "subsequent" capacitor alone "remains in place". This can lead to mechanical stability problems, since the relatively fine electrode structure is completely unprotected. This is where the invention comes in, by virtue of the fact that according to embodiments of the invention it is provided that a mechanical "support" is always present; this deliberately avoids mechanical loads, e.g., mechanical stresses.

The mechanical support for the electrode structure can be provided in its interior—i.e., in the interior of the cup in the case of a cup-shaped electrode structure—or on the outside of the electrode structure—i.e, in the cup exterior in the case of a cup-shaped electrode structure. More details in this respect can be found, inter alia, in the subclaims.

BRIEF DESCRIPTION OF THE DRAWINGS

The invention will now be explained below on the basis of exemplary embodiments. In the associated drawings:

FIGS. 5-10 show a second exemplary embodiment of the method according to the invention;

FIGS. 16-20 show a fifth exemplary embodiment of the method according to the invention;

FIGS. 21-24 show a sixth exemplary embodiment of the method according to the invention.

Figure 2:
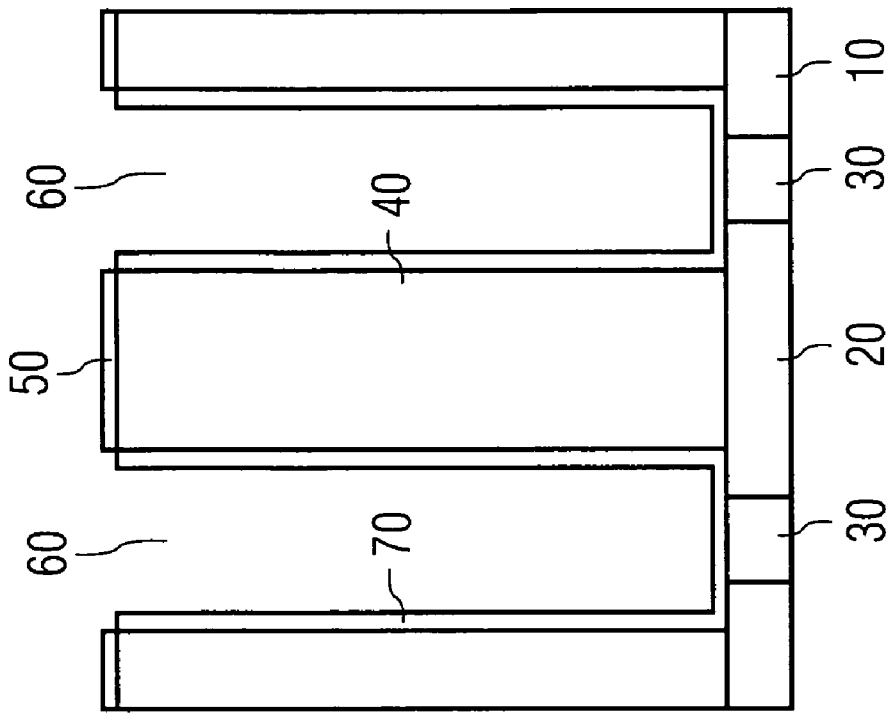
FIGS. 1-4 show a first exemplary embodiment of the method according to the invention.

The following list of reference symbols can be used in conjunction with the figures:

10 Substrate
20 Insulation layer
30 Terminal pad
40 Silicon-germanium auxiliary layer
50 Hard mask layer
60 Recess
70 Electrode layer
80 Electrode cup
90 Dielectric layer
100 Further electrode layer
110 Cup inner wall 120 Cup outer wall
130 Capacitor
140 Capacitor
200 Substrate
210 Silicon base layer
220 Silicon nitride separating layer
230 Capacitor terminal pad
240 Capacitor terminal pad
250 Insulation layer
255 Silicon nitride stop layer
260 Auxiliary layer
270 Mask layer assembly
280 Silicon capping layer
290 USG layer
300 Silicon nitride layer
310 Recess
320 Recess
330 Insulation layer
340 Titanium nitride electrode layer
350 Interior electrode
360 Interior electrode
370 Further insulation layer
380 Silicon
390 Residual regions of the silicon nitride mask
400 Capping layer
410 Capacitor
420 Capacitor
430 Silicon
440 Silicon
450 Interior electrode
460 Further insulation layer
470 Titanium nitride electrode layer
480 Silicon
490 SiO$_2$ caps
500 Cup outer region
510 Outer titanium nitride electrode
520 Silicon
530 Capping layer
540 Silicon layer
550 Silicon dioxide
560 Exterior electrode
570 Silicon
580 Insulation layer
590 Silicon
600 Capping layer
610 Substrate
620 Insulation layer
630 Terminal pads
640 Silicon auxiliary layer
650 Hard mask layer
660 Recesses
670 Electrode layer
680 "Free-standing" electrode cup
690 Dielectric layer
700 Further electrode layer
710 Cup inner wall
720 Cup outer wall
730 Capacitor
740 Capacitor
800 Recess
810 Recess
820 Titanium nitride layer
830 Capacitor terminal pad
840 Capacitor terminal pad
850 Dielectric layer
860 Silicon layer
870 Further dielectric layer
880 Further titanium nitride layer
910 Capacitor
920 Capacitor
930 Silicon

DETAILED DESCRIPTION OF ILLUSTRATIVE EMBODIMENTS

Figure 1:
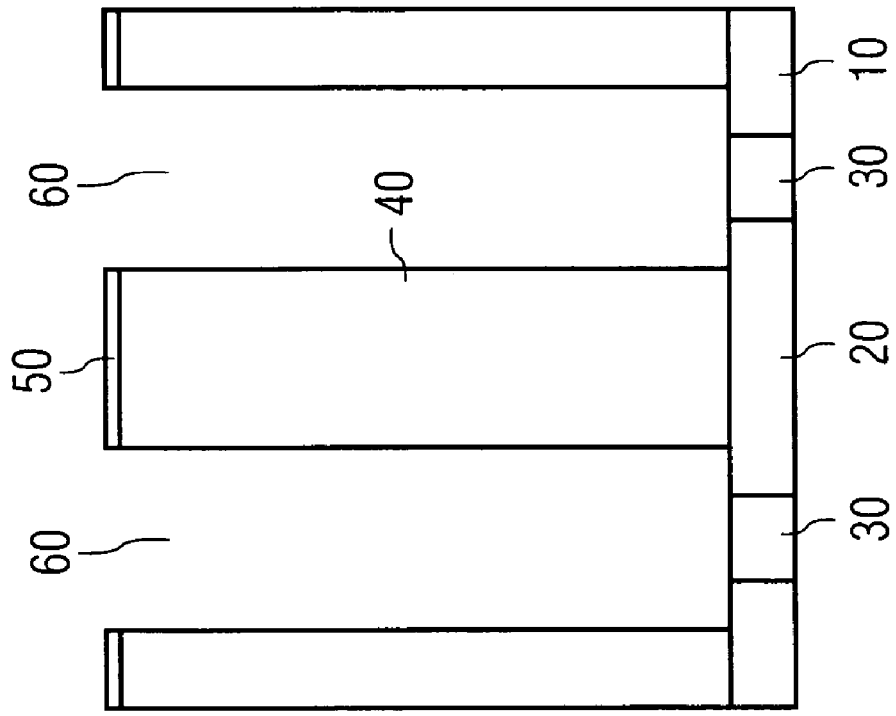

FIG. 1 shows a substrate 10 that has been provided with an insulation layer 20. The figure also reveals two terminal pads 30, to each of which a capacitor is to be applied.

First of all, a silicon-germanium auxiliary layer 40 is applied to the substrate 10 and provided with a hard mask layer 50. The hard mask layer 50 is then patterned in a photolithography step; then, the silicon-germanium auxiliary layer 40 is etched away down to the insulation layer 20. This etching step is preferably carried out using an HBr-containing etchant or using hydrogen peroxide ($H_2O_2$). Recesses 60 are formed in the silicon-germanium auxiliary layer 40 during this etching step.

In a subsequent process step, the recesses 60 are coated with an electrode material of TiN material (or of another suitable material, such as for example Ru, TaN or the like). This forms an electrode layer 70, which, as will become clear below, will form an interior electrode of the two capacitors. The resulting structure is shown in FIG. 2.

During the production of the electrode layer 70, the latter will initially also be deposited above the hard mask layer 50, so that the electrode layer 70 initially still has to be removed in the region of the hard mask layer 50 in order to arrive at the structure, which is only diagrammatically depicted in FIG. 2. However, these intermediate steps have been omitted from the figures, for the sake of clarity.

Figure 3:
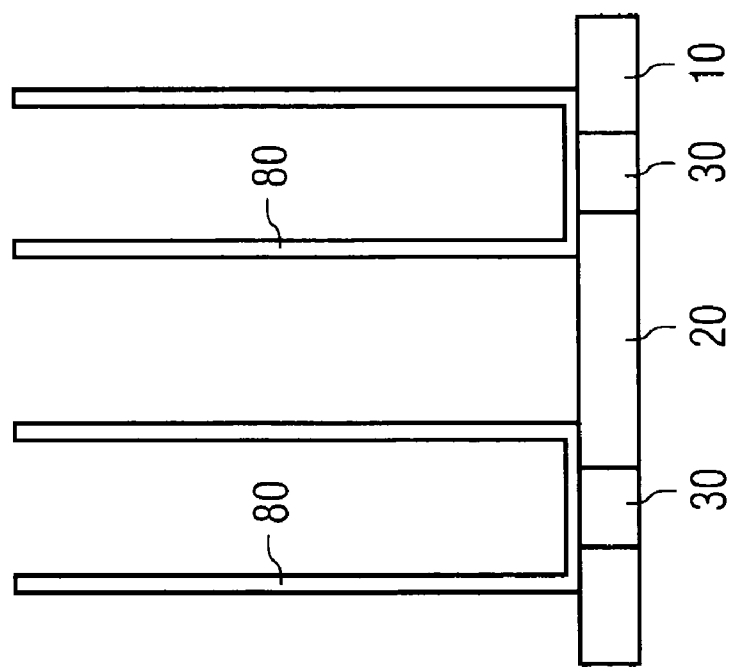
Figure 12:
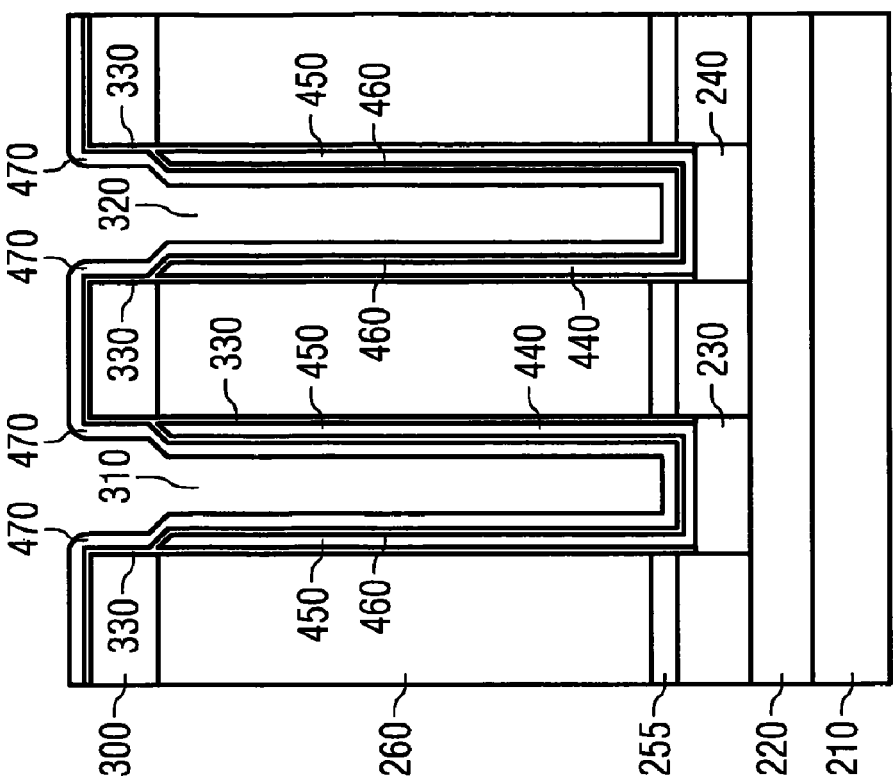
FIGS. 12-15 show a fourth exemplary embodiment of the method according to the invention.

In a subsequent process step, first of all the hard mask layer 50 is removed, for example using an etchant containing hydrofluoric acid, e.g., DHF. Then, the silicon-germanium auxiliary layer 40 is completely removed using hydrogen peroxide. Since hydrogen peroxide scarcely attacks the TiN electrode layer 70 at all, the "free-standing" electrode cups 80 illustrated in FIG. 3 are formed. Therefore, in this method the auxiliary layer 40 serves as a sacrificial layer, since it is completely removed.

Figure 4:
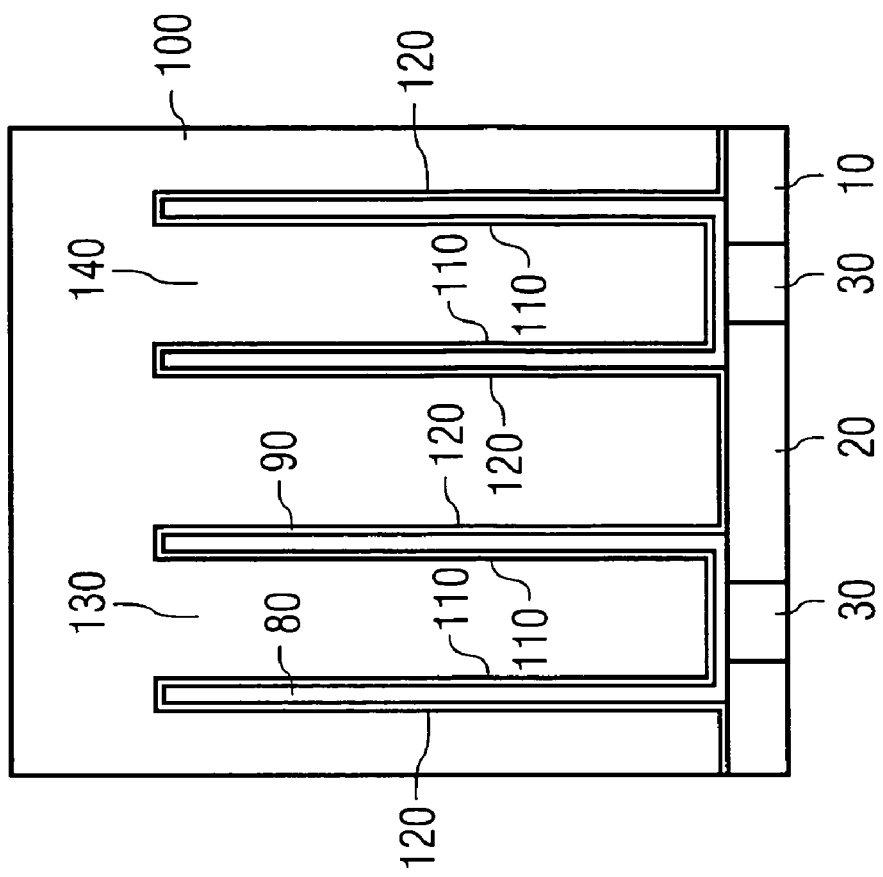

Then, the two electrode cups 80 are coated with a dielectric layer 90. A further electrode layer 100, which in each case forms an exterior electrode for each of the two capacitors 130 and 140, is deposited on the dielectric layer 90. These exterior electrodes extend both over the cup inner wall 110 and over the cup outer wall 120 of the, in each case, cup-shaped electrode structures of the capacitors 130 and 140 (see FIG. 4).

Consequently, each of the two capacitors 130 and 140, in each case, has a terminal pad 30 as "lower" capacitor terminal. The "upper" capacitor terminal is, in each case, formed by the further electrode layer 100.

To summarize, the method explained in connection with FIGS. 1 to 4 is distinguished by the fact that the auxiliary or sacrificial layer 40 used is a silicon-germanium layer, which can be handled and etched particularly easily, since the etching selectivity between the hard mask layer 50 used and the silicon-germanium sacrificial layer 40, on the one hand, and the selectivity between the silicon-germanium sacrificial layer 40 and the electrode layer 70 are particularly great.

A second exemplary embodiment of the method according to the invention will now be described with reference to FIGS. 5 to 10.

FIG. 5 shows a substrate 200 comprising, for example, a silicon base layer 210, a silicon nitride separating layer 220 and two capacitor terminal pads 230 and 240, which are embedded in an insulation layer 250. The structure of the substrate 200 is only an example. The substrate 200 may alternatively be of completely different construction. By way of example, the silicon base layer 210 and the silicon nitride separating layer 220 may be absent or replaced by other layers or layer assemblies. Incidentally, the same is also true of the other exemplary embodiments explained in connection with FIGS. 11 to 28.

First of all, an SiN stop layer 255 and a silicon auxiliary layer 260 are applied to the substrate 200. The thickness of the silicon auxiliary layer may, for example, be a few micrometers. A mask layer assembly 270, which may comprise, for example, a silicon capping layer 280, a silicon oxide layer—e.g., a USG layer (USG: undoped Si glass)—290 and a silicon nitride layer 300, is applied to the auxiliary layer 260. The mask layer assembly 270 is masked as part of a lithography step and then etched. The result is the layer sequence illustrated in FIG. 6.

Then, the auxiliary layer 260 and the SiN stop layer 255 are etched away in the region of the openings in the mask layer assembly 270. Moreover, the silicon capping layer 280 and the USG layer 290 are removed. This produces the layer sequence with the two recesses 310 and 320 illustrated in FIG. 7.

The two recesses 310 and 320 are "lined" with a dielectric insulation layer 330 (preferably with a high dielectric constant, for example aluminum oxide). This insulation layer 330 is opened up in the region of the two capacitor terminal pads 230 and 240, so that a titanium nitride electrode layer 340 applied to the insulation layer 330 is electrically connected to the capacitor terminal pads 230 and 240. The TiN layer 340 is removed above and to the sides of the hard mask layer 300 by a plasma etch with a high RIE lag, i.e., by an etch that etches more slowly within deep structures than at the surface, or even does not remove any material at all within these deep structures.

The titanium nitride electrode layer 340 forms interior, cup-shaped electrodes 350 and 360 for the capacitors that are to be fabricated. The resulting structure is shown in FIG. 8.

Then, the two interior electrodes 350 and 360 are coated with a further dielectric insulation layer 370 (material identical to that used for the layer 330) so that the interior electrodes 350 and 360 are completely insulated with respect to the outside. The inner region of the interior electrodes 350 and 360 is then filled with silicon 380, so as to produce the overall structure illustrated in FIG. 9.

In a subsequent step, the remaining silicon nitride layer 300 is virtually completely removed. All that remains is residual regions 390, so that the silicon 380 located in the inner region of the two cup-shaped electrodes 350 and 360 can be connected to the remaining exterior silicon auxiliary layer 260 by deposition of a silicon capping layer 400. The result is two capacitors 410 and 420, the outer electrodes of which are electrically connected to one another and, which each have separate capacitor terminal pads 230 and 240.

Figure 11:
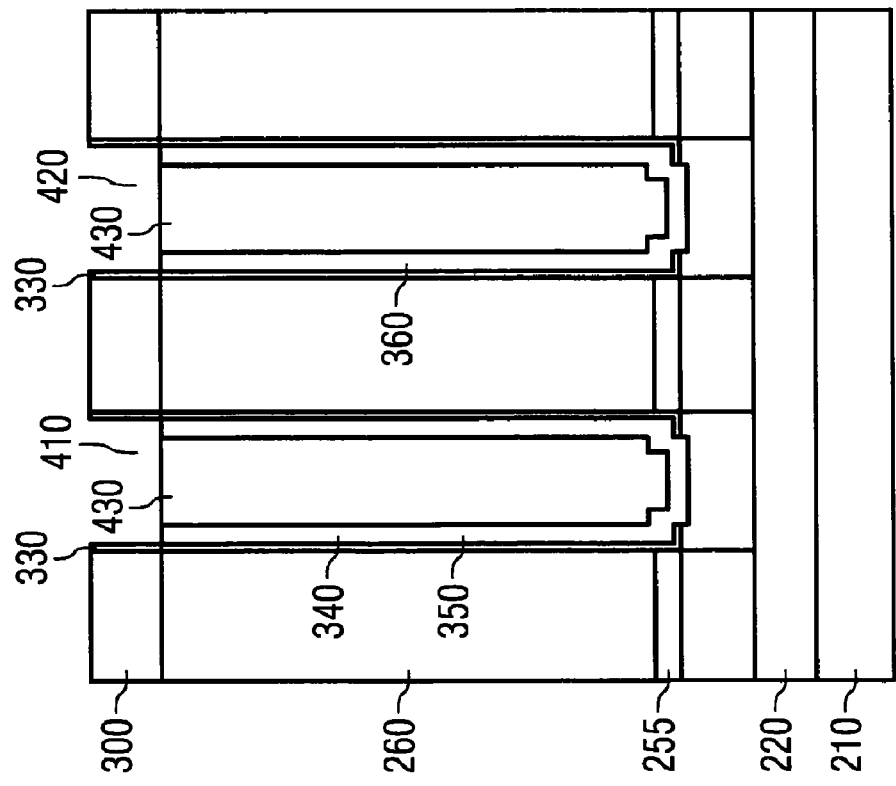
FIG. 11 shows a third exemplary embodiment of the method according to the invention.
Figure 13:
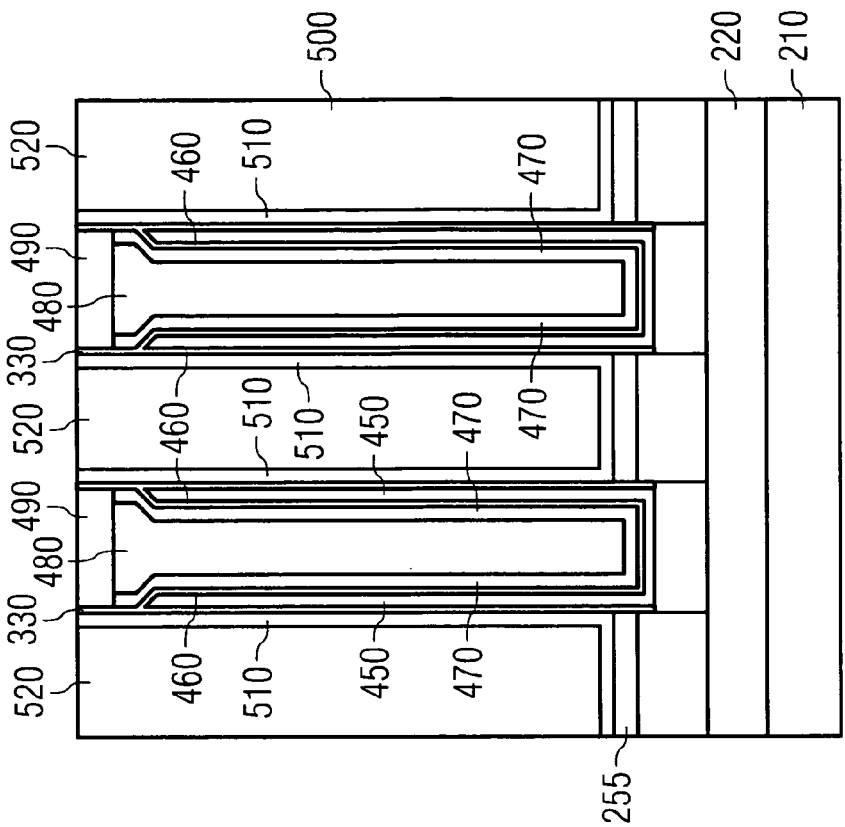

A third exemplary embodiment of the method according to the invention will now be explained with reference to FIG. 11.

Starting from the structure shown in FIG. 8, in this third exemplary embodiment, silicon 430 is deposited directly into the inner region of the two interior electrodes 350 and 360. Two capacitors 410 and 420, in which the inner region of the cup—consisting of the silicon 430—forms an inner electrode and the outer region of the cup—formed by the auxiliary layer 260—forms an outer electrode, electrically separated from the inner electrode, of the capacitor, are formed in this way.

A fourth exemplary embodiment of the method according to the invention will now be explained with reference to FIGS. 12 to 15.

Starting from the structure that has already been explained in connection with FIG. 7, the two recesses 310 and 320 are first of all "lined" with the insulation layer 330, which is opened up in the region of the two terminal pads 230 and 240 for the purpose of subsequent contact-connection. Then, a silicon layer 440, which will in each case form interior, cup-shaped electrodes 450 of the capacitors, is applied. The cup-shaped electrodes 450 are insulated with a further insulation layer 460 in the inner region of the cup, and then a titanium nitride electrode layer 470 is applied. The result is the layer sequence illustrated in FIG. 12.

Then, the inner region of the cup is filled with silicon 480 and closed off by a silicon dioxide cap 490. The resulting structure is subjected to a CMP (CMP: Chemical Mechanical Polishing) step, which ultimately results in the layer sequence illustrated in FIG. 13.

Thereafter, the silicon auxiliary layer 260 is completely removed in the cup outer region 500, so that the outer insulation layer 330 is uncovered on the outer side. Free-standing column-like electrode cups, which are mechanically stabilized by the inner silicon filling 480, are formed. Unlike in the method described in connection with FIGS. 1 to 4, therefore, the electrode cups do not stand freely without any mechanical protection around them, since they are supported by an inner mechanical support in the form of the silicon filling.

Then, an outer titanium nitride electrode layer 510, which forms an exterior electrode arranged on the cup outer wall, is applied to the insulation layer 330.

Figure 14:
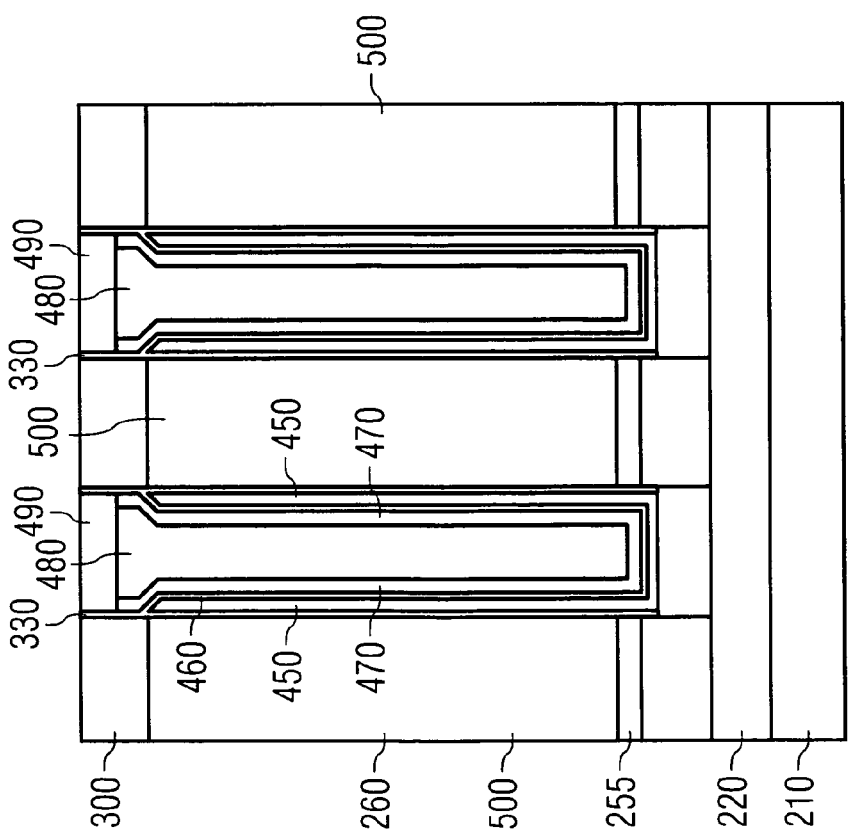

Next, silicon 520 is deposited on the outer titanium nitride electrode layer 510, so as to form the layer sequence illustrated in FIG. 14. In a subsequent CMP polishing step, the upper layer material is removed, so that in particular the silicon dioxide caps 490 disappear and in each case uncover the cup inner region. Then, the outer titanium nitride electrode 510 and the interior titanium nitride electrode layer 470 can be electrically connected by deposition of a capping layer 430 of preferably highly doped silicon. The titanium nitride electrode layer 470 and the outer titanium nitride electrode layer 510, therefore, form an exterior electrode of the two capacitors 410 and 420 and at the same time form the cup inner wall and the cup outer wall of the cup-shaped electrode structure. The two titanium nitride layers 470 and 510 in this case completely enclose the inner electrode 450 of the two capacitors 410 and 420, which is formed by the silicon layer 440.

Figure 15:
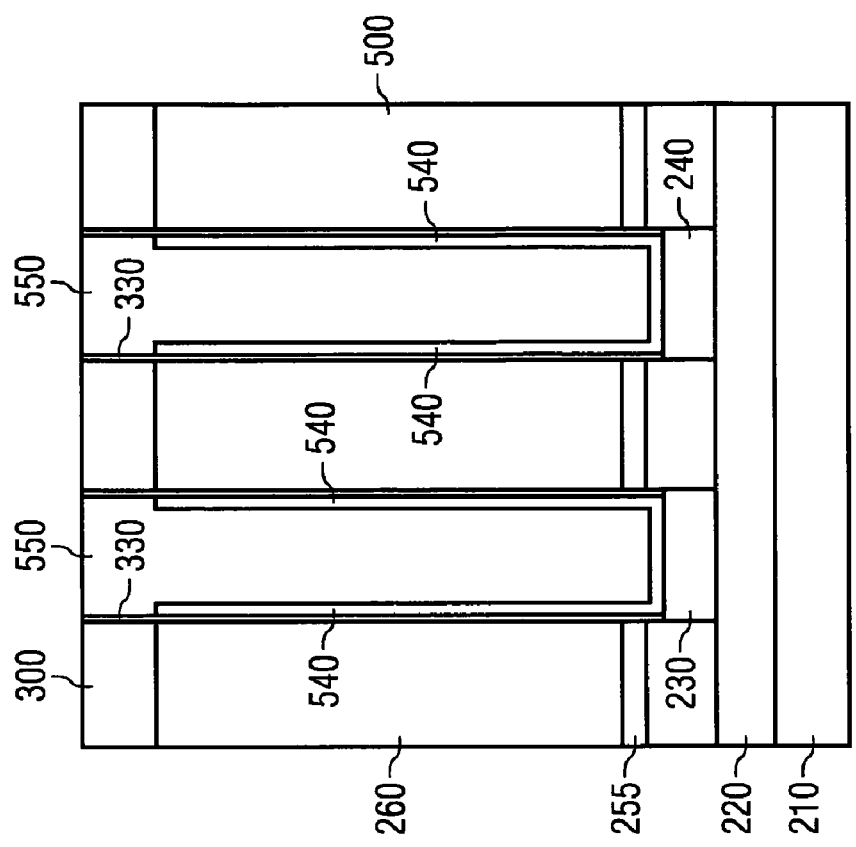
Figure 16:
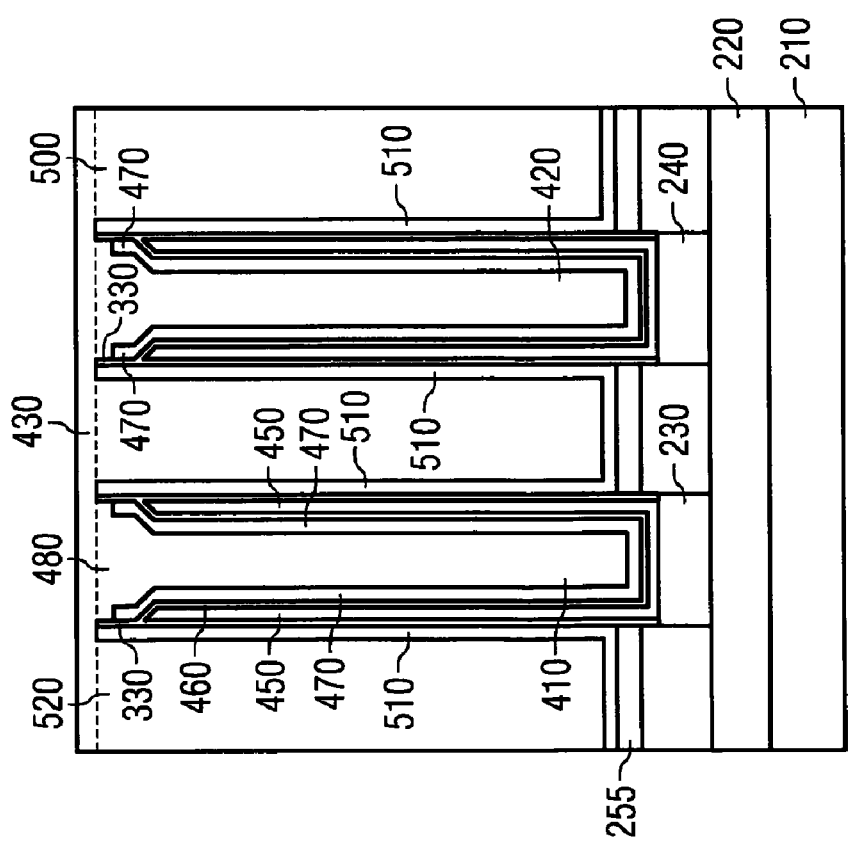

The resulting structure is shown in FIG. 15.

A fifth exemplary embodiment of the method according to the invention is explained in connection with FIGS. 16 to 20. The starting point in this case is the structure explained in connection with FIG. 7. The two recesses 310 and 320 are each lined with an insulation layer 330, which is opened up at the bottom for contact-connection purposes. Then, a silicon layer 540 is deposited.

The silicon layer 540 is removed above and to the sides of the hard mask layer 300 by a plasma etch with a high RIE lag, i.e., by an etch that etches more slowly within deep structures than at the surface, or even does not remove any material at all within the deep structures. The silicon layer 540 will form an inner electrode of the cup-shaped electrode structure that is to be produced, as will become clear below.

The inner regions of the two recesses 310 and 320 are then completely filled with silicon dioxide 550. The result is the structure illustrated in FIG. 16.

Figure 17:
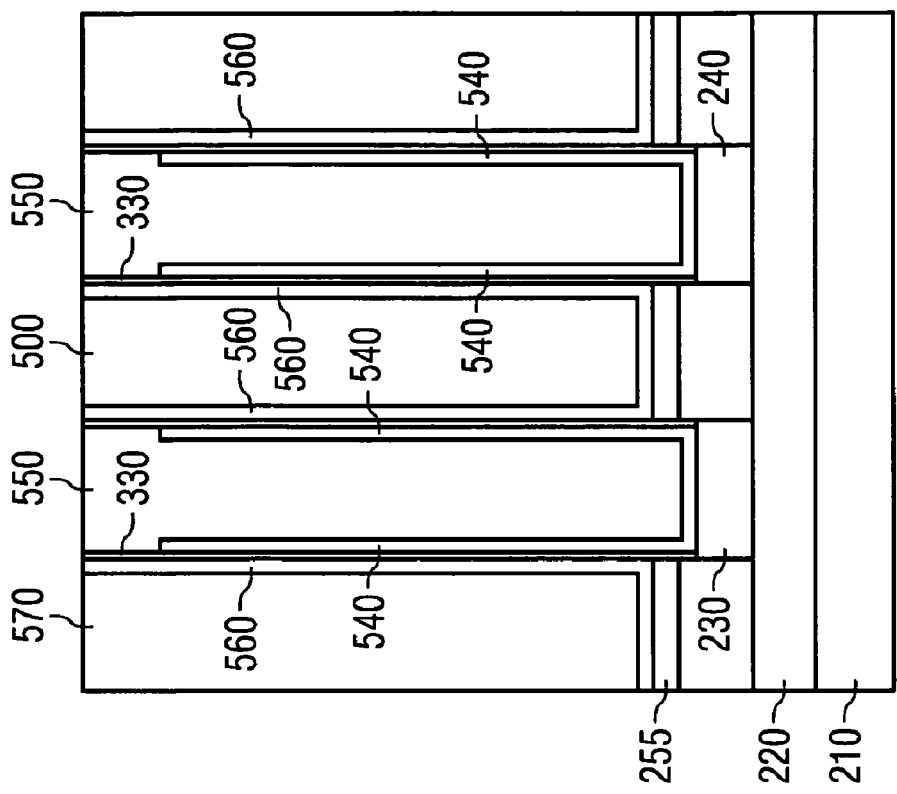
Figure 18:
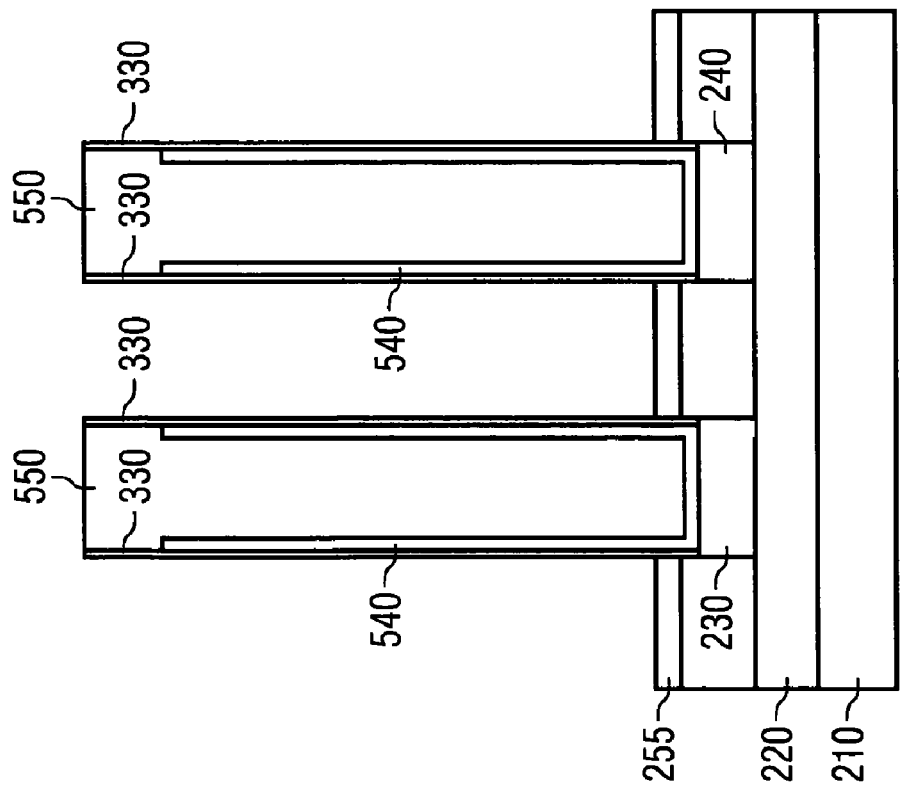
Figure 24:
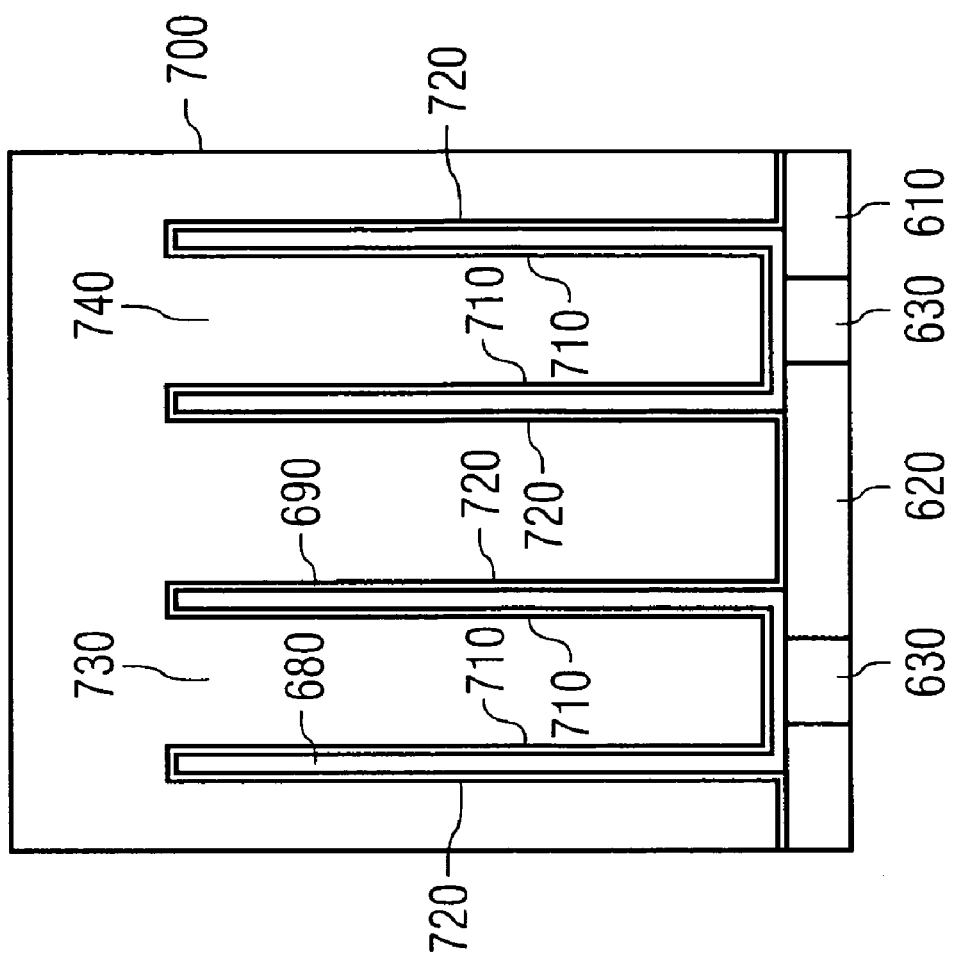

Then, both the silicon nitride mask layer 300 and the cup outer region 500 of the auxiliary layer 260 are etched away, so that only the insulation layer 330, the interior silicon electrode 540 and the silicon dioxide filling 550 remain. FIG. 17 shows the resulting column-like structure. This column-like structure is very stable, in particular significantly more stable than the free-standing electrode structure shown in FIG. 3, on account of the silicon dioxide filling 550, and consequently damage to the electrode structure during further processing is relatively unlikely.

Then, an exterior electrode is applied to the outer insulation layer 330, in the form of a titanium nitride layer 560. Then, silicon 570 is deposited, and the silicon on the surface of the silicon dioxide filling 550 is removed by a CMP step. The result is the structure shown in FIG. 18.

Next, the silicon dioxide 550 is removed from the inner region of the cup, so that the interior silicon electrode 540 is uncovered. A further insulation layer 580 is applied to the interior silicon electrode 540. Then, the cup inner region is filled with silicon 590. FIG. 19 shows the resulting structure.

The structure shown in FIG. 19 is subjected to a CMP step, so that the cup inner region and the cup outer region of the electrode structures of each of the two capacitors 410 and 420 is uncovered. Then, the electrode 580, which forms the cup inner wall of the electrode structure, and the electrode 560, which forms the cup outer wall of the electrode structure, can be connected to one another by deposition of a conductive capping layer 600. The interior silicon electrode 540 is enclosed by these two electrodes 580, 560.

This then forms the capacitors 410 and 420 illustrated in FIG. 20, in which the exterior electrode forms both the cup inner wall and the cup outer wall, and in which the exterior electrode in each case completely encloses the interior electrode.

In the method described in connection with FIGS. 1 to 4, it is also possible for an auxiliary layer of silicon to be used instead of an auxiliary layer consisting of silicon-germanium; this is explained in more detail below with reference to FIGS. 21 to 24.

FIG. 21 shows a substrate 610 that is provided with an insulation layer 620. It is also possible to recognize two terminal pads 630, to each of which a capacitor is to be applied.

First of all, a silicon auxiliary layer 640 is applied to the substrate 610 and provided with a hard mask layer 650. The hard mask layer 650 may, for example, be a layer assembly such as the mask layer assembly 270 described with reference to FIG. 6, i.e., a layer assembly comprising a polycrystalline silicon capping layer, a silicon dioxide layer (e.g. USG layer), and a silicon nitride layer.

The hard mask layer 650 is then patterned as part of a photolithography step. Next, the silicon auxiliary layer 640 is etched away down to the insulation layer 620. This etching step is preferably carried out by a halogen-based (e.g., HBr, Cl$_2$ or SF$_6$) anisotropic plasma etching process. This etching step forms recesses 660 (see FIG. 21) in the silicon auxiliary layer 640.

In a subsequent process step, the recesses 660 are coated with an electrode material of TiN material (or of another suitable material, such as for example Ru, TaN or the like). This forms an electrode layer 670, which, as can be seen below, will form an interior electrode of the two capacitors to be fabricated. The resulting structure is shown in FIG. 22.

During the production of the electrode layer 670, the latter will initially also be deposited above the hard mask layer 650, and consequently the electrode layer 670 initially has to be removed in the region of the hard mask layer 650, in order to arrive at the structure which is only diagrammatically depicted in FIG. 2. However, these intermediate steps have been omitted from the figures, for the sake of clarity.

Figure 23:
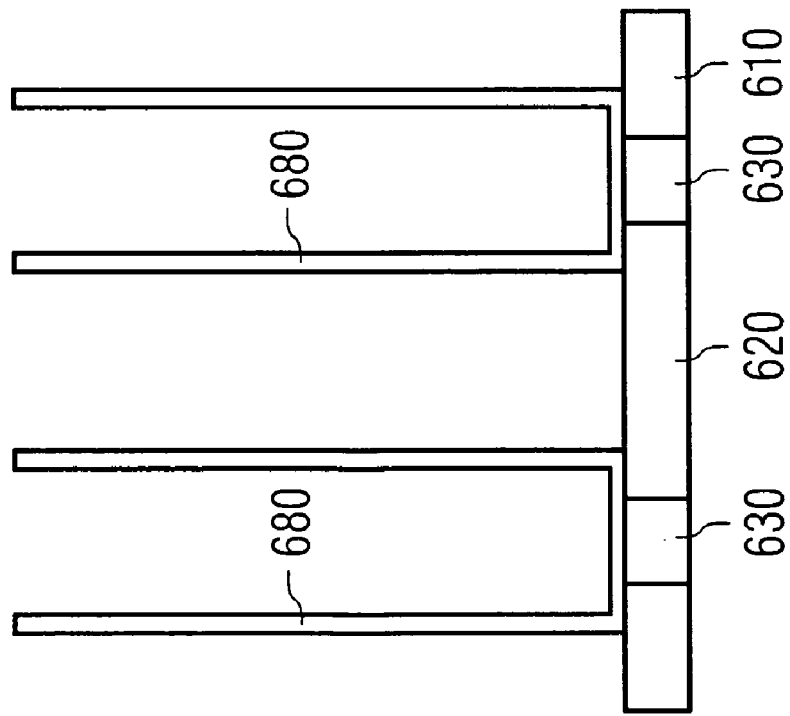

In a subsequent process step, first of all the hard mask layer 650 is removed, for example using an etchant which contains hydrofluoric acid, e.g., BHF. Then, the silicon auxiliary layer 640 is completely removed using an NH$_4$OH-containing etchant. Since an NH$_4$OH-containing etchant scarcely attacks the TiN electrode layer 670 at all, the "free-standing" electrode cups 680 illustrated in FIG. 23 are formed. In the method, therefore, the auxiliary layer 640 serves as a sacrificial layer, since it is completely removed.

Then, the two electrode cups 680 are coated with a dielectric layer 690. A further electrode layer 700, which in each case forms an exterior electrode for each of the two capacitors 730 and 740, is deposited on the dielectric layer 690. These exterior electrodes extend both over the cup inner wall 710 and over the cup outer wall 720 of the in each case cup-shaped electrode structures of the capacitors 730 and 740 (see FIG. 24).

Consequently, each of the two capacitors 730 and 740 has a terminal pad 630 as "lower" capacitor terminal; the "upper" capacitor terminal is in each case formed by the further electrode layer 700.

To summarize, the method explained in connection with FIGS. 21 to 24 is distinguished by the fact that the auxiliary or sacrificial layer 740 used is a silicon layer, which is particularly easy to handle and etch, since the etching selectivity between the hard mask layer 650 used and the silicon sacrificial layer 640, on the one hand, and also the selectivity between the silicon sacrificial layer 640 and the electrode layer 670 are particularly great.

A seventh exemplary embodiment of the method according to the invention will now be described with reference to FIGS. 25 to 28.

Starting from the structure illustrated in FIG. 6, the silicon auxiliary layer 260 is etched down to the silicon nitride stop layer 255. The recesses 800 and 810 that are formed are then lined with a titanium nitride layer 820, which will form a cup outer wall of an exterior electrode of the subsequent capacitors. After the titanium nitride layer 820 has been deposited, this layer is anisotropically etched, so that its base region adjacent to the silicon nitride stop layer 255 is removed.

Moreover, of the mask layer assembly 270, the silicon capping layer 280 and the USG layer 290 are removed; therefore, all that remains of the mask layer assembly 270 is the silicon nitride layer 300. This produces the layer sequence with the two recesses 800 and 810 illustrated in FIG. 25.

Figure 26:
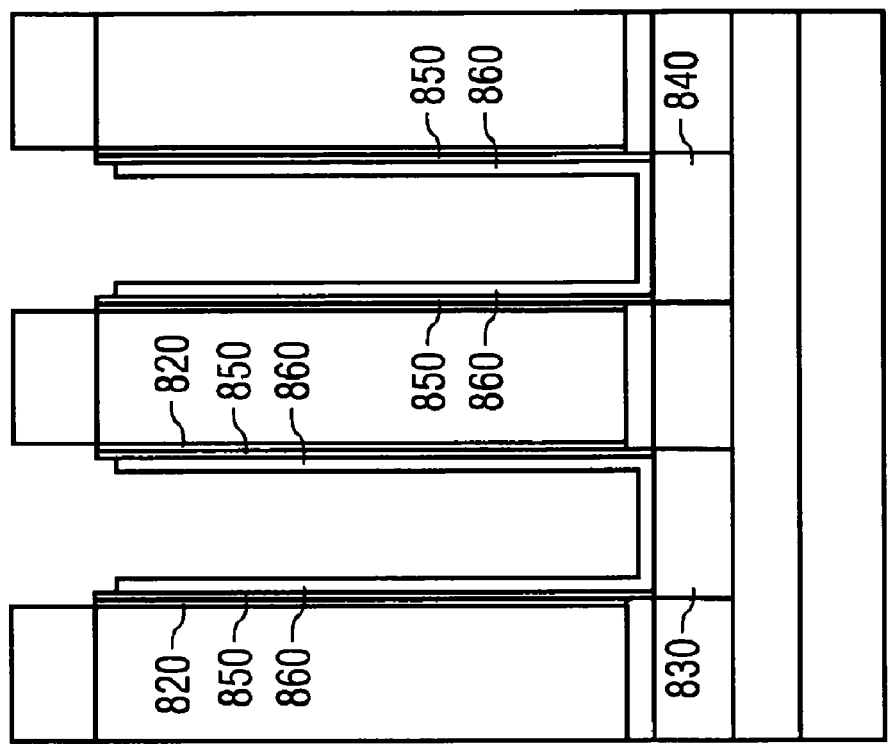
FIGS. 25-28 show a seventh exemplary embodiment of the method according to the invention.
Figure 25:
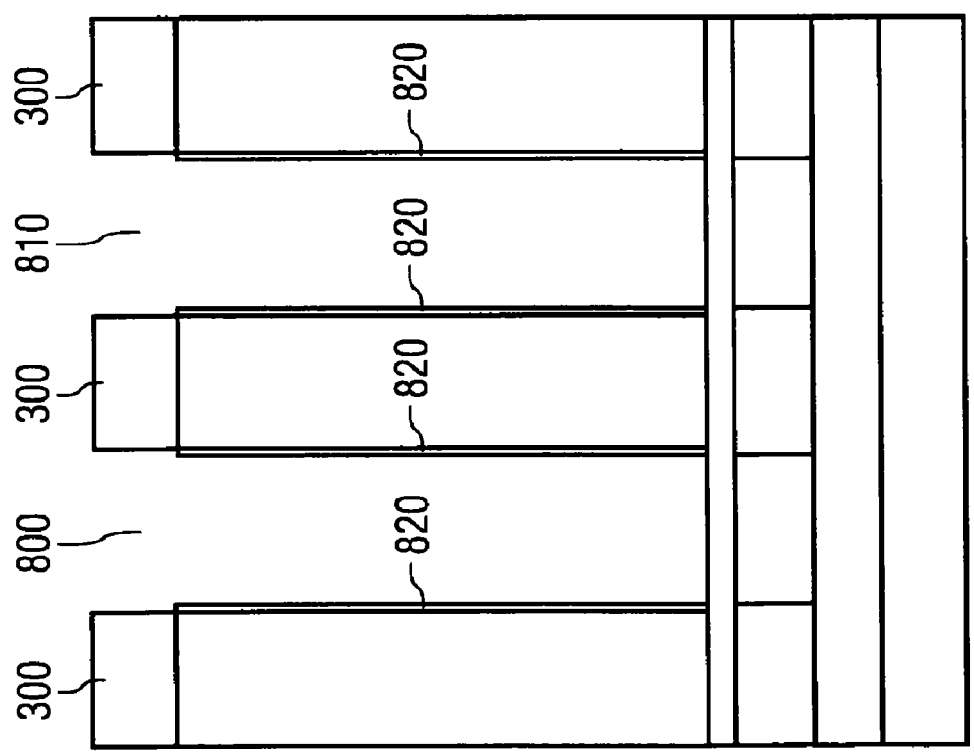
Figure 27:
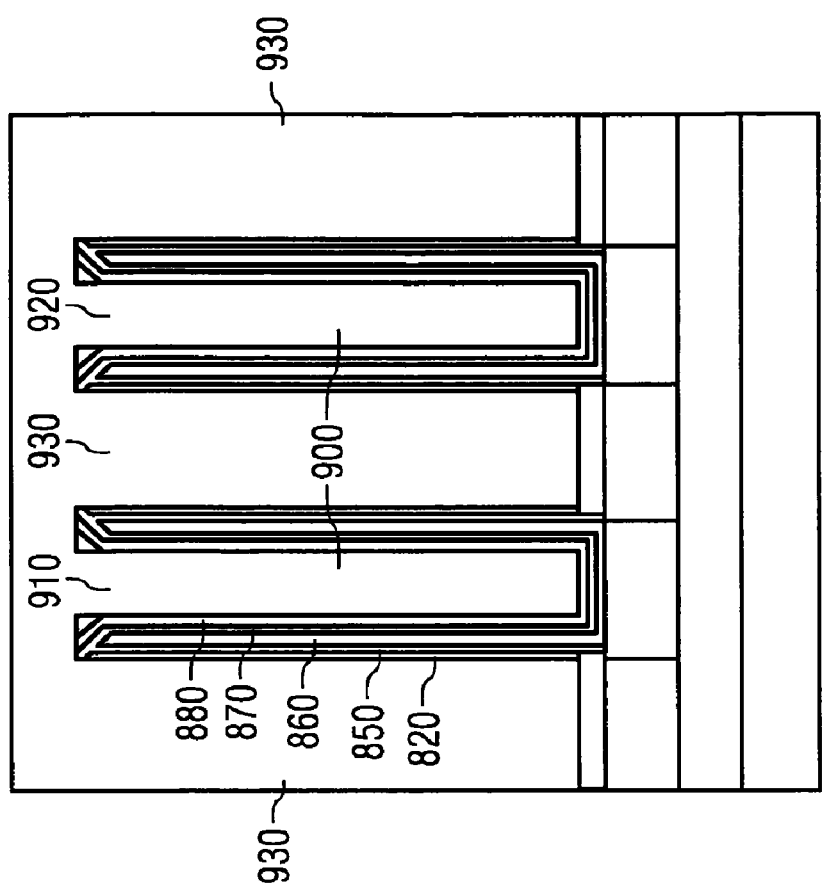

Then, the silicon nitride stop layer 255 is opened up in the region of the two capacitor terminal pads 830 and 840, and a dielectric layer 850 with a high dielectric constant (high-K dielectric) is applied. This layer 850 is likewise anisotropically etched in order to uncover the two capacitor terminal pads 830 and 840. Then, a silicon layer 860 or metal layer is deposited. This layer will form an interior electrode of the subsequent capacitors. FIG. 26 shows the resulting structure.

The silicon layer 860 is then coated with a further dielectric layer 870 with a high dielectric constant (high-K dielectric). Next, a further titanium nitride layer 880, which will form a cup inner wall of an exterior electrode of the subsequent capacitors, is applied to this further dielectric layer 870 (see FIG. 27).

Next, the structure is etched over the entire surface, removing inter alia the silicon nitride layer 300. The resulting structure is coated with doped silicon, with the still "empty" cup inner region 890 being completely filled with silicon 900. The silicon 900 electrically connects the two titanium nitride layers 820 and 880 and, therefore, the cup inner wall of the exterior electrode and the cup outer wall of the exterior electrode. The exterior electrode surrounds the silicon layer 860, which acts as an interior electrode.

Figure 28:
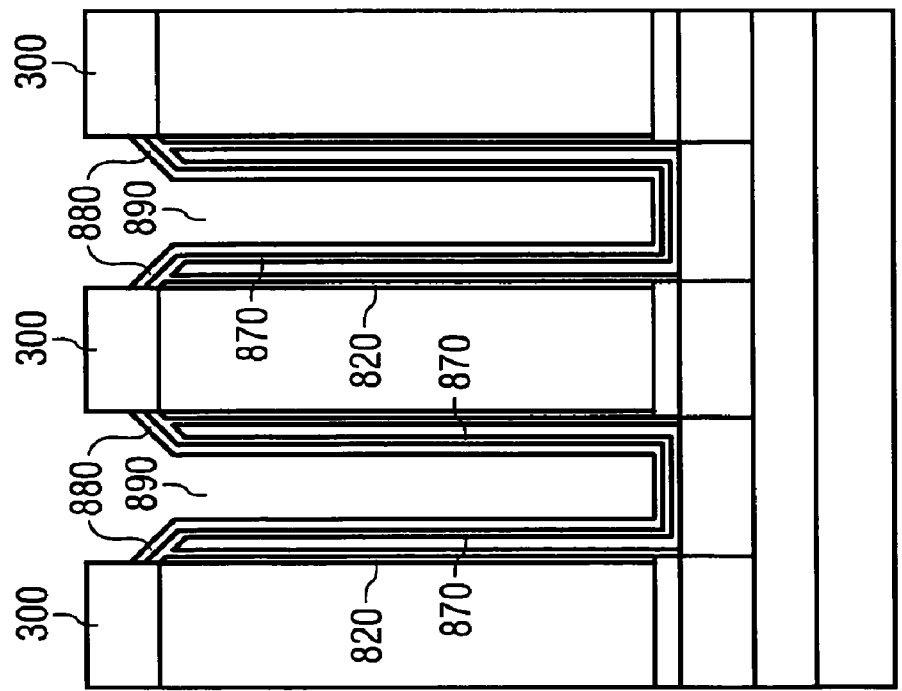

This produces the capacitors 910 and 920 with cup-shaped electrodes shown in FIG. 28. Incidentally, if desired for further process steps, the silicon 930 of the silicon auxiliary layer 260, which surrounds the two capacitors 910 and 920, can be removed as part of an etching step using an etching mask, since the electrode structure would remain supported by the silicon filling 900 in the cup interior 890.

It should be noted that the methods that have been explained in connection with FIGS. 5 to 20 and 25 to 28 can also be carried out with the aid of an SiGe auxiliary layer or SiGe sacrificial layer, for example using etchants containing hydrogen peroxide. Reference should be made to the statements given in connection with FIGS. 1 to 4 and 21 to 24 for suitable process parameters.

Moreover, reference should be made to the literature with regard to the processing of silicon-germanium material. By way of example, the following documents are incorporated herein by reference.

1. "Formation of polycrystalline silicon germanium/HfO$_2$ gate stack structure using inductively coupled plasma etching" (Jinghao Chen, Kian Ming Tan, Nan Wu, Won Jong Yoo and Daniel S H Chan); J. Vac. Sci. Technol. A 21 (4), July/August 2003, pages 1210-1217).
2. "Interactive effects in the reactive ion etching of SiGe alloys" (G. S. Oehrlein, Y. Zhang, G. M. W. Kroesen, E. de Frésart, and T. D. Bestwick; Appl. Phys. Lett. 58 (20), 20 May 1991, pages 2252-2254).
3. "Reactive ion etching of $Si_{1-x}Ge_x$ alloy with hydrogen bromide" (Lin Guo, Kaicheng Li, Daoguang Lio, Yihong Qu, Jing Zhang, Qiang Yi, Shiliu Xu; Journal of Crystal Growth 227-228 (2001), pages 801-804).
4. "Selective Dry Etching of Germanium with Respect to Silicon and Vice Versa" G. S. Oehrlein, T. D. Bestwick, P. L. Jones, M. A. Jaso, and J. L. Lindström; Electrochem. Soc., Vol. 138, No. 5, May 1991, pages 1443-1452).

What is claimed is:

1. A method for fabricating a capacitor, the method comprising:
    forming a semiconductor layer over a substrate;
    etching a cup shaped recess into the semiconductor layer;
    forming an interior cup shaped electrode for a capacitor in the recess, said interior cup shaped electrode including a cup inner wall and a cup outer wall; and
    forming an exterior electrode along both the inner wall and outer wall of the cup, wherein a portion of the exterior electrode along the cup inner wall and a portion of the exterior electrode along the cup outer wall are produced in different process steps.

2. The method according to claim 1, wherein the semiconductor layer is a sacrificial layer that is partially or completely removed as part of the fabrication of the capacitor.

3. The method according to claim 2, wherein the semiconductor layer is completely or partially removed using an etchant containing hydrogen peroxide or using pure hydrogen peroxide.

4. The method according to claim 1, wherein the exterior electrode is separated from the interior electrode by an insulator layer.

5. The method according to claim 1, wherein the portion of the exterior electrode along the cup inner wall is produced before the portion of the exterior electrode along the cup outer wall.

6. The method according to claim 1, wherein the portion of the exterior electrode along the cup inner wall is produced after the portion of the exterior electrode along the cup outer wall.

7. The method according to claim 1, wherein the portion of the exterior electrode along the cup inner wall and the portion of the exterior electrode along the cup outer wall are connected by a conductive capping layer.

8. The method according to claim 7, wherein the conductive capping layer comprises a doped silicon layer.

9. The method according to claim 1, wherein the exterior electrode and/or the interior electrode are formed from TiN or a TiN-containing material.

10. The method according to claim 1, wherein the interior electrode is formed from doped silicon.

11. The method according to claim 1, wherein the portion of the exterior electrode along the cup inner wall or the portion of the exterior electrode along the cup outer wall, or both, is produced from doped silicon.

12. The method according to claim 1, wherein the capacitor is coupled to a terminal of a transistor.

13. The method according to claim 12, further comprising producing a DRAM memory element using the capacitor.

14. The method according to claim 13, further comprising producing a capacitor-over-bitline element using the capacitor.

15. The method according to claim 1, wherein the capacitor is integrated in a semiconductor structure.

16. The method according to claim 1, wherein the interior electrode is always mechanically supported throughout the entire method.

17. The method according to claim 16, wherein the interior electrode is mechanically supported by the semiconductor layer, which remains along the outer wall.

18. The method according to claim 1, further comprising:
    after forming an interior cup shaped electrode, depositing a mechanical support filling along the cup inner wall; and
    before forming an exterior electrode along the inner wall of the cup, removing the mechanical support filling.

19. The method according to claim 1, wherein the semiconductor layer comprises a SiGe layer.

20. The method according to claim 19, wherein the recess is etched into the SiGe layer using an etchant containing hydrogen peroxide or using pure hydrogen peroxide.

21. The method according to claim 19, wherein the SiGe layer has a Ge content of at least 40%.

* * * * *